US006218852B1

(12) United States Patent
Smith et al.

(10) Patent No.: US 6,218,852 B1
(45) Date of Patent: Apr. 17, 2001

(54) AUTOMATED CIRCUIT BOARD TESTING APPARATUS

(76) Inventors: Paul E. Smith, 17511 Meredith Dr., Santa Ana, CA (US) 92705; Jon T. Olis, 105 Roswell Ave., Long Beach, CA (US) 90803; Michael P. Callahan, 16702 Pocono St., Valinda, CA (US) 91744; Richard D. Bauer, 14306 Sycamore Ave., Poway, CA (US) 92064; Fred R. Behrendt, 11811 Daniel Ave., Garden Grove, CA (US) 92840

( * ) Notice: Subject to any disclaimer, the term of this patent is extended or adjusted under 35 U.S.C. 154(b) by 0 days.

(21) Appl. No.: 09/182,397

(22) Filed: Oct. 29, 1998

(51) Int. Cl.$^7$ .................................................. G01R 31/02
(52) U.S. Cl. .......................... 324/761; 324/754; 324/758; 324/158.1
(58) Field of Search ..................................... 324/761, 754, 324/755, 158.1, 758, 72.5; 209/571, 573; 29/701

(56) References Cited

U.S. PATENT DOCUMENTS

| | | | |
|---|---|---|---|
| 3,776,675 | 12/1973 | Veneria | 425/139 |
| 4,588,092 | * 5/1986 | Moechnig et al. | 209/573 |
| 4,787,143 | * 11/1988 | Yagi et al. | 29/833 |
| 4,804,078 | 2/1989 | Scata | 198/346 |
| 4,926,118 | * 5/1990 | O'Connor et al. | 324/758 |
| 5,184,068 | 2/1993 | Twigg et al. | 324/158 F |
| 5,269,632 | * 12/1993 | Tsutsumi | 324/758 |
| 5,584,118 | * 12/1996 | Furukawa et al. | 29/701 |
| 5,611,436 | 3/1997 | Ashby | 209/573 |
| 5,614,819 | * 3/1997 | Nucci | 324/158.1 |
| 5,667,077 | * 9/1997 | Goins, III | 209/573 |
| 5,704,489 | 1/1998 | Smith | 209/2 |
| 5,848,705 | * 12/1998 | Gianpaolo et al. | 209/751 |
| 5,954,205 | * 9/1999 | Smith | 209/2 |
| 6,031,384 | * 2/2000 | Furuta | 324/760 |

OTHER PUBLICATIONS

Memory Module Test Handler—MTH–1000, of 2 pages.
Memory/Circuit Board Systems depicting the PC100, PA2000, PA2000–AF, PA2000–AW, IPA3000, IDP1000 and TL5000 of 1 page.
SIMM/DIMM Automatic Shipping Tray Loader "TL5000" of 1 page.
Automatic Handler for SIMM/DIMM memory boards "PC100" of 1 page.
SIMM/DIMM Integrated Test, Label & Conveyer Workstation of 1 page.
Nortek Automation, Inc. of 1 page.
Exatron; "Automatic Memory–Module Header"; 2 pages.
Integrated Test Systems; "Excel 828 Simm/Dimm Handler"; 2 pages.
MC Systems, Inc.; "Model 838–DIM"; 2 pages.
MC Systems, Inc.; "Model 818–SIM"; 2 pages.
ESC; "We Take a Hands Off Approach to Simms Testing"; 2 pages.

* cited by examiner

*Primary Examiner*—Safet Metjahic
*Assistant Examiner*—T. R. Sundaram

(57) ABSTRACT

An automated handling apparatus for testing and labeling a printed circuit board. The apparatus comprises a housing having at least one tray exchanger assembly attached thereto. Disposed on the tray exchanger assembly is a cassette tray which accommodates at least one circuit board, and is selectively movable between first and second positions by the tray exchanger assembly. Also attached to the housing is a testing assembly for conducting a desired testing protocol upon the circuit board, a labeler assembly for applying a label to the circuit board subsequent to the completion of the testing protocol, and a loader assembly for selectively transporting the circuit board between the tray exchanger, testing, and labeling assemblies.

34 Claims, 5 Drawing Sheets

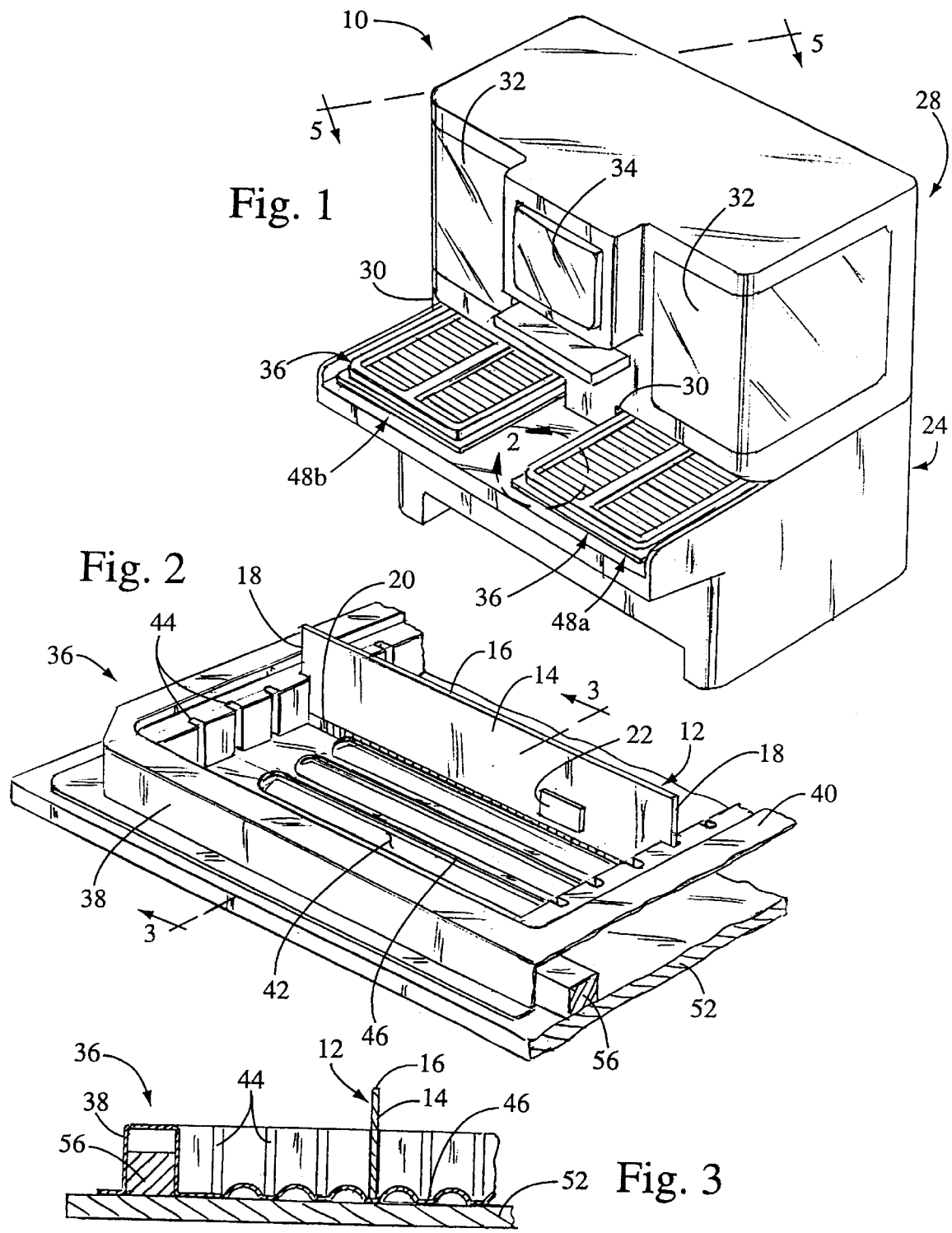

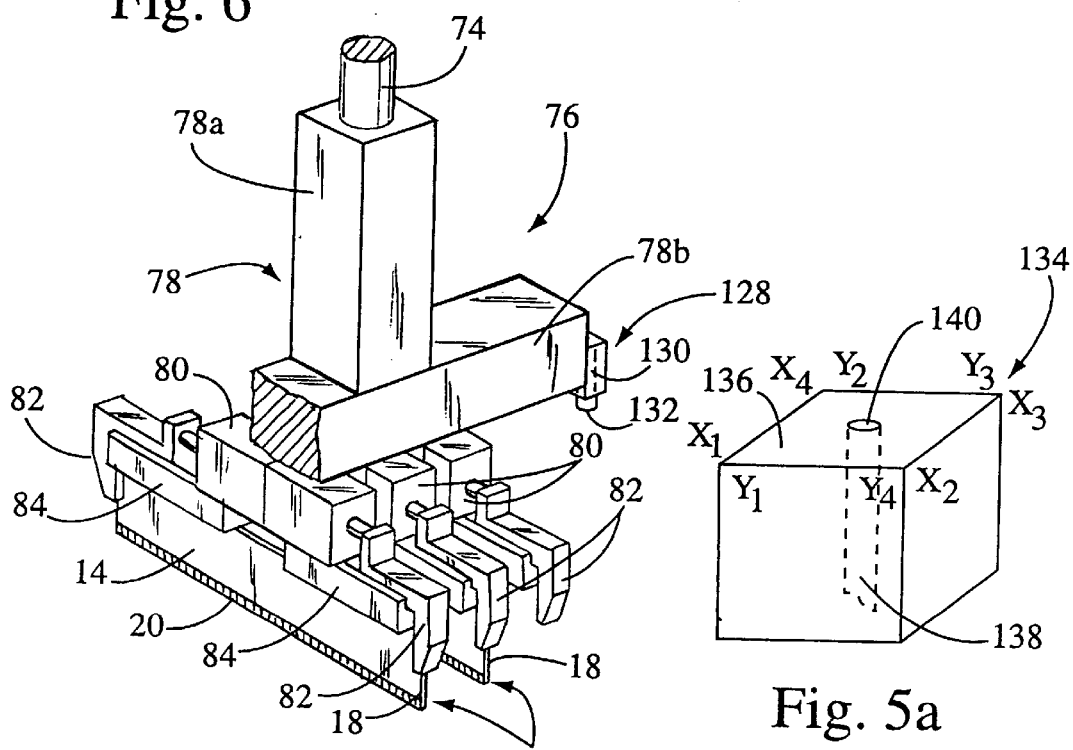
Fig. 6
Fig. 5a
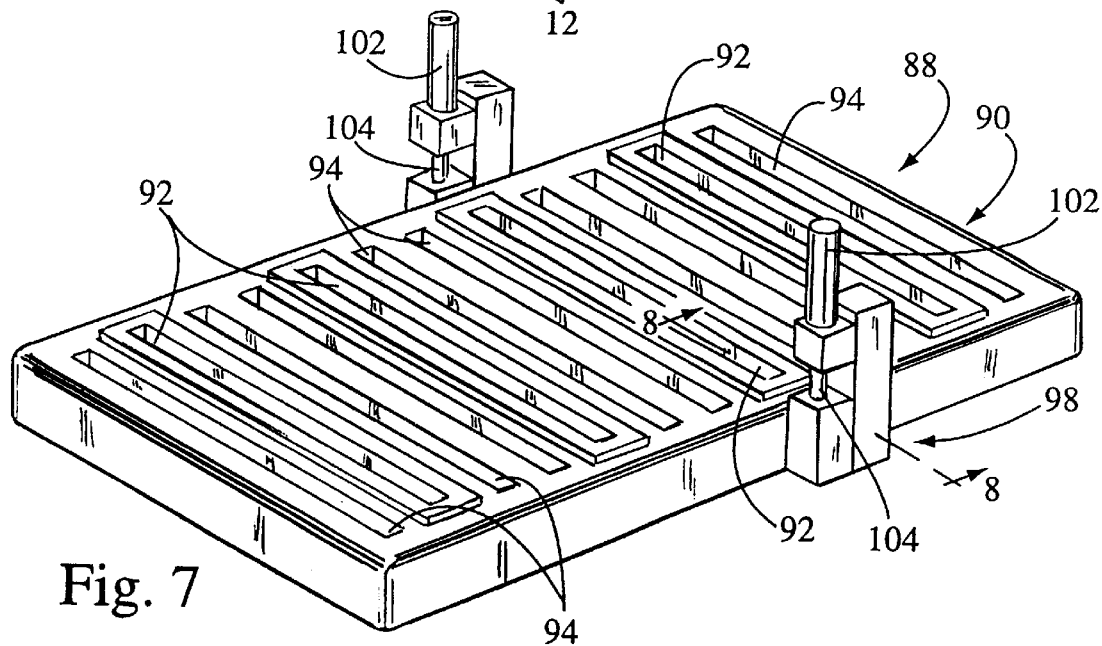
Fig. 7

AUTOMATED CIRCUIT BOARD TESTING APPARATUS

FIELD OF THE INVENTION

The present invention relates generally to parts handling equipment, and more particularly to an automated handling apparatus for testing and optionally labeling printed circuit boards such as memory boards.

BACKGROUND OF THE INVENTION

There is currently known in the prior art various handling devices which are used to facilitate the testing of small printed circuit boards which accommodate one or more memory devices. These "memory boards" are commonly referred to as SIMM circuit boards or SIMM boards (which include memory chips disposed on one side or face thereof) and DIMM circuit boards or DIMM boards (which include memory chips disposed on both sides or faces thereof). Also known in the prior art are handling devices which are used to facilitate the application of a label onto SIMM and/or DIMM boards subsequent to the testing thereof.

The prior art SIMM/DIMM handlers are generally similar to each other with respect to their structural details and operational methodology. Though accomplishing the task of testing SIMM and/or DIMM boards, such prior art handlers possess certain deficiencies which detract from their overall utility, with such deficiencies being related to, among other things, cost, reliability and accuracy. Many of these deficiencies are highlighted in Applicant's U.S. Pat. No. 5,704,489 entitled SIMM/DIMM BOARD HANDLER issued Jan. 6, 1998, the disclosure of which is incorporated herein by reference.

Perhaps the most significant deficiency of the prior art SIMM/DIMM handlers is that the feeding of the circuit board into a testing assembly of the handler requires that the circuit board travel lengthwise or longitudinally along a conveyor of the handler in only one direction and at only one height. As such, these prior art handlers are exceedingly large, and must be sized having a width which is at least four times the length of the circuit board to properly accommodate the various sub-assemblies of the handler, including the testing and sorting sub-assemblies is thereof.

A further deficiency is that the prior art SIMM/DIMM handlers are overly complex in construction and include numerous operating and coordinating elements, thus requiring excessive manual set-up time and increasing their susceptibility to general failure and high maintenance down time. More particularly, contributing to the extreme complexity of the prior art SIMM/DIMM handlers is their construction from a combination of electromechanical and pneumatic components, including stepper motors and conveyors, in addition to pneumatic actuators. Such construction causes the prior art SIMM/DIMM handlers to be noisy, bulky, slow acting, large in size, and susceptible to frequent down time. Further, in these prior art SIMM/DIMM handlers, little provision is made for machine action alternation due to malfunction, with such handlers being difficult to set-up for circuit boards of differing sizes.

In recognition of the deficiencies of the prior art SIMM/DIMM handlers, Applicant developed the SIMM/DIMM circuit board handling and testing apparatus described in U.S. Pat. No. 5,704,789. Though this particular SIMM/DIMM circuit board handler of the Applicant overcomes many of the deficiencies of the prior art SIMM/DIMM handlers, it lacks the ability to simultaneously test multiple SIMM or DIMM circuit boards or to apply labels thereto subsequent to the completion of the testing process, thus requiring the insertion of the tested circuit board into another circuit board handler which is adapted to facilitate the application of a label thereto. A further deficiency of Applicant's prior SIMM/DIMM circuit board handler and others similar thereto in construction is that the circuit boards are fed thereinto and ejected therefrom downwardly, which sometimes causes damage to the circuit boards.

The present invention overcomes the deficiencies of the prior art SIMM/DIMM handlers, as well as the shortcomings associated with Applicant's previous SIMM/DIMM circuit board handler, by providing an automated handling apparatus which, in addition to being adapted to concurrently test multiple SIMM or DIMM circuit boards, is further adapted to facilitate the application of a label thereto subsequent to the completion of the testing process. Additionally, the structure and operational sequence of the present automated handling apparatus is specifically adapted to facilitate the performance of the testing and labeling functions in a "gentle" manner which minimizes the risk of damage to the circuit boards.

SUMMARY OF THE INVENTION

In accordance with the present invention, there is provided an automated handling apparatus for testing and optionally labeling a printed circuit board, and more particularly a SIMM board or DIMM board. The SIMM or DIMM circuit boards for which the present testing and labeling apparatus is particularly suited each have generally rectangular configurations, and define opposed pairs of longitudinal and lateral edges. The present apparatus is specifically adapted to perform its testing and labeling functions concurrently on multiple circuit boards, thus substantially increasing its output speed as compared to circuit board handler devices currently known in the prior art.

In the preferred embodiment, the present testing and labeling apparatus comprises a housing having a pair of tray exchanger assemblies attached thereto. Each of the tray exchanger assemblies is configured to accommodate two (2) identically configured cassette trays, and operable to alternately move such cassette trays between first and second positions. More particularly, each tray exchanger assembly is configured such that the movement of the cassette tray originally oriented in the first position to the second position results in the concurrent movement of the remaining cassette tray originally oriented in the second position to the first position. Each cassette tray is preferably fabricated from a plastic material, and configured so as to accommodate multiple circuit boards arranged in two (2) side-by-side rows.

In addition to the tray exchanger assemblies, the present testing and labeling apparatus comprises a testing assembly which is also attached to the housing and used for conducting a testing protocol on each of the circuit boards. The testing assembly itself comprises a test fixture which defines at least one and preferably four test slots, each of which is sized and configured to partially receive a circuit board, including one longitudinal edge thereof. In addition to the test fixture, the testing assembly includes at least one and preferably four ejection mechanisms which are each cooperatively engaged to the test fixture and operable to assist in the ejection of the circuit boards from within respective ones of the test slots of the test fixture.

Each of the ejection mechanisms of the testing assembly itself comprises a pair of lift tabs which are pivotally connected to the test fixture and disposed at respective ones of the opposed ends of the corresponding test slot of the test fixture adjacent the bottom surface thereof. In addition to the lift tabs, each ejection mechanism includes a pair of cylinders which are mechanically coupled to respective ones of the lift tabs. The cylinders are operable to concurrently move the lift tabs between a testing position whereat the lift tabs are substantially continuous with the bottom surface of the corresponding test slot, and an ejection position whereat the lift tabs are pivoted upwardly so as to protrude into the test slot. The cylinders of each ejection mechanism may comprise pneumatic or hydraulic cylinders.

The present testing and labeling apparatus further comprises a labeler assembly which is attached to the housing and used for applying a label to each of the circuit boards subsequent to the completion of the testing protocol thereon. The labeler assembly comprises an elongate, rotatable labeler arm which defines opposed ends. Attached to the labeler arm adjacent respective ones of the opposed ends thereof is a pair of label grippers of the labeler assembly. Each of the label grippers is operable to selectively grasp and release a label to effectuate the transfer thereof from a label strip which includes multiple labels to a circuit board. More particularly, each of the label grippers includes at least one fluid passage which extends therein and is oriented such that the creation of a vacuum within the fluid passage facilitates the releasable engagement of the label to the label gripper, with the discontinuation of the vacuum within the fluid passage allowing the label to be released from the label gripper and adhered to the circuit board. In addition to the labeler arm and label grippers, the labeler assembly includes a stripper bar for facilitating the release of the labels from the label strip in succession upon the advancement of the label strip thereover. As each label is released from the label strip, it is releasably engaged by one of the label grippers and rotated upwardly by the labeler arm for adhesion to a circuit board.

In addition to the above-described components, the automated testing and labeling apparatus of the present invention includes a loader assembly which is attached to the housing and used to transport circuit boards between the tray exchanger assemblies, testing assembly, and labeler assembly. The loader assembly itself comprises a robotic arm which is rotatable about first, second and third generally parallel loader axes, and moveable along the third loader axis. Attached to the robotic arm is a gripper which is adapted to receive and releasably hold at least one and preferably three circuit boards. To facilitate the holding of three circuit boards at the same time, the gripper assembly itself comprises three actuator and three pairs of gripper fingers which are movably attached to respective ones of the actuators. The gripper fingers of each pair are movably attached to a respective actuator in opposed relation to each other, and are selectively movable by the actuator between a holding position whereat the gripper fingers are engagable to respective ones of the lateral edges of a circuit board, and a release position whereat the distance separating the gripper fingers from each other exceeds the length of the circuit board. The gripper fingers of each pair are sized such that when in the holding position, one of the longitudinal edges of the circuit board held thereby protrudes from the distal ends thereof.

In the present testing and labeling apparatus, the housing defines a hollow, interior chamber region. The tray exchanger assemblies are partially disposed within the chamber region of the housing, with the testing, loader and labeler assemblies being completely disposed therewithin. Attached to the housing is a temperature control unit which is operable to maintain the temperature within the chamber region at a prescribed level. In this respect, the temperature control unit may be manipulated as needed to selectively raise or lower the temperature within the chamber region to the desired level.

Further in accordance with the present invention, there is provided an automated method of testing and applying a label to a printed circuit board using an automated testing and labeling apparatus which includes an input tray exchanger assembly having a pair of cassette trays positioned thereupon, an output tray exchanger assembly having a pair of cassette trays positioned thereupon, a testing assembly, a loader assembly, and a labeler assembly. The method comprises the initial step of positioning multiple untested circuit boards upon at least one of the cassette trays of the input tray exchanger assembly. Thereafter, the cassette tray including the untested circuit boards is positioned upon the input tray exchanger assembly such that it is disposed in the first position. The input tray exchanger assembly is then actuated so as to facilitate the movement of the cassette tray including the untested circuit boards to the second position concurrently with the movement of the remaining cassette tray to the first position such that the untested circuit boards are removable from the cassette tray in the second position via the loader assembly.

Subsequent to the actuation of the input tray exchanger assembly in the above-described manner, two untested circuit boards are concurrently removed from the cassette tray of the input tray exchanger assembly which is in the second position by the loader assembly and transported thereby to the testing assembly. Upon transporting the two untested circuit boards to the testing assembly, the loader assembly is operable to replace two previously tested circuit boards within the testing assembly with the two untested circuit boards just removed from within the cassette tray of the input tray exchanger assembly in the second position. Upon the completion of this replacement procedure, the two tested circuit boards now being held by the loader assembly are transported thereby to the labeler assembly. One of the tested circuit boards is then brought into contact with one of the label grippers of the labeler assembly by the loader assembly, thus facilitating the application or adhesion of a label thereto. Subsequent to the adhesion of a label to one of the tested circuit boards held within the loader assembly, the labeler arm is rotated 180 degrees, with the other tested circuit board then being brought into contact with the remaining label gripper by the loader assembly so as to facilitate the application or adhesion of a label thereto. Subsequent to labels being applied to each of the two tested circuit boards held within the loader assembly, such circuit boards are transported by the loader assembly to the cassette tray of the output tray exchanger assembly which is in the second position.

BRIEF DESCRIPTION OF THE DRAWINGS

These, as well as other features of the present invention, will become more apparent upon reference to the drawings wherein:

FIG. 1 is a front, top perspective view of the automated testing and labeling apparatus constructed in accordance with a first embodiment of the present invention;

FIG. 2 is an enlarged partial perspective view of the encircled region of FIG. 1, illustrating the engagement of a cassette tray of the present testing and labeling apparatus to a tray exchanger assembly thereof, and the receipt of a circuit board into the cassette tray;

FIG. 3 is a cross-sectional view taken along line 3—3 of FIG. 2;

FIG. 5a is a perspective view of the sensor block of the present testing and labeling apparatus;

FIG. 6 is a perspective view of a gripper of the loader assembly of the present testing and labeling apparatus;

FIG. 7 is a perspective view of the testing assembly of the present testing and labeling apparatus, illustrating one of the ejection assemblies used in conjunction therewith;

DETAILED DESCRIPTION OF THE PREFERRED EMBODIMENTS

Figure 4:
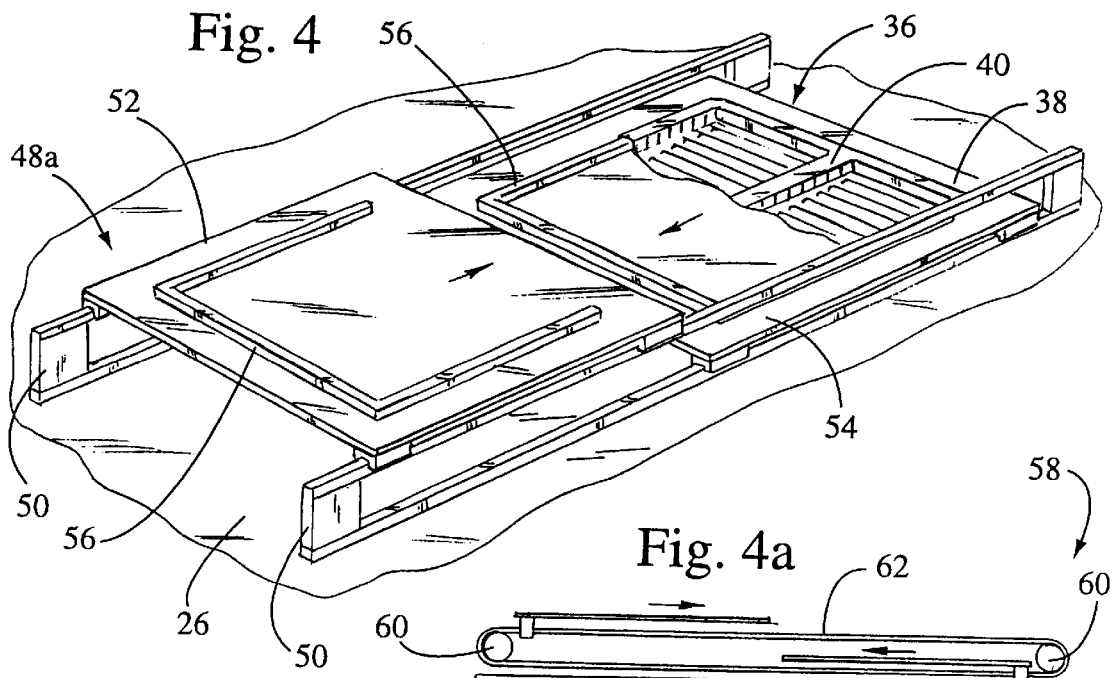
FIG. 4 is a perspective view of one of the tray exchanger assemblies of the present testing and labeling apparatus.

Referring now to the drawings wherein the showings are for purposes of illustrating preferred embodiments of the present invention only, and not for purposes of limiting the same, FIG. 1 perspectively illustrates an automated handling apparatus 10 for testing and labeling printed circuit boards. The apparatus 10 is particularly suited for performing the testing and labeling functions upon memory boards including those commonly referred to as SIMM circuit boards or SIMM boards and DIMM circuit boards or DIMM boards. Such SIMM or DIMM boards typically include a base board which has a generally rectangular configuration and defines opposed pairs of longitudinal and lateral edges. In SIMM boards, the base board typically includes multiple memory chips which are secured to one common side or face thereof, while in DIMM boards such memory chips are typically secured to both of the opposed sides or faces of the base board. Additionally, in SIMM and DIMM boards, the base board is typically provided with multiple electrically conductive pads which extend along one of its longitudinal edges and are disposed on one or both sides thereof.

In those figures of the present application wherein a circuit board is depicted, such circuit board will simply be identified as a "circuit board" labeled with the reference numeral 12, with the base board thereof being labeled with the reference numeral 14, the opposed longitudinal edges of the base board 14 each being labeled with the reference numeral 16, the opposed lateral edges of the base board 14 each being labeled with the reference numeral 18, the electrically conductive pads of the base board each being labeled with the reference numeral 20, and any memory chip(s) secured to the base board 14 each being labeled with the reference numeral 22. Those of ordinary skill in the art will recognize that any reference to the "circuit board 12" in the following detailed description is intended to represent either a SIMM board, a DIMM board, or any similarly configured circuit board.

Figure 5:
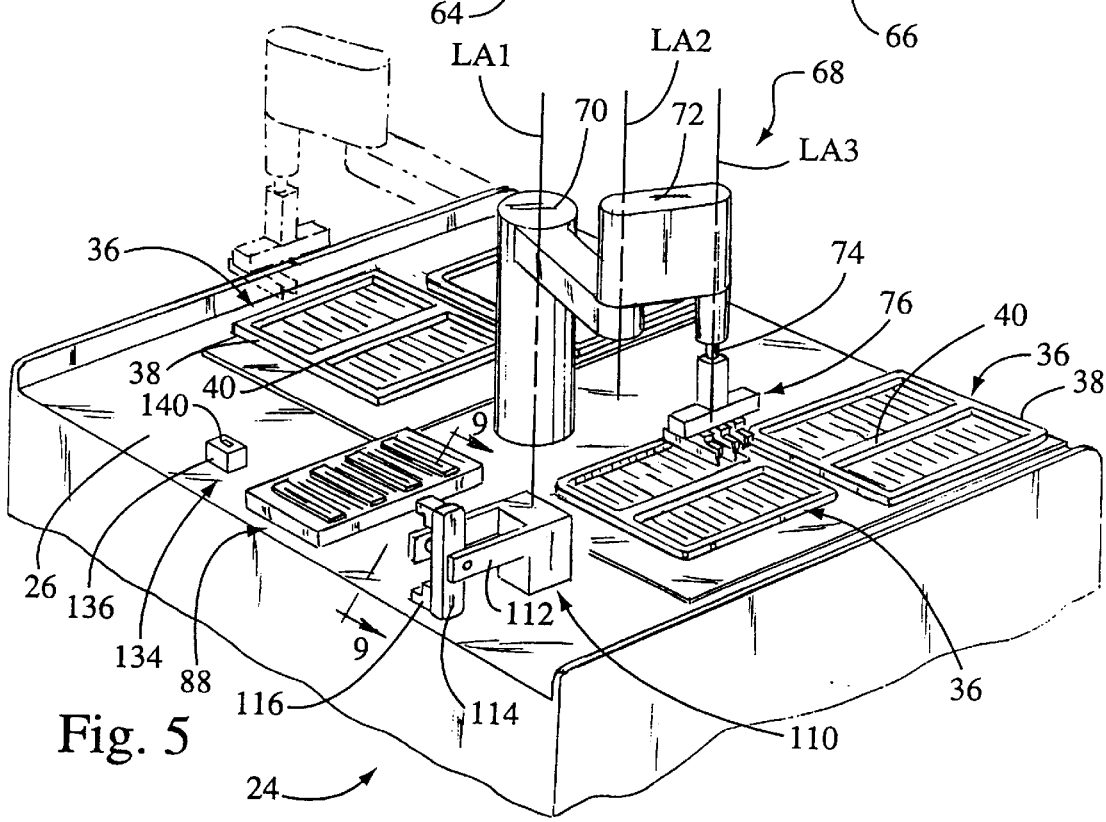
FIG. 5 is a top, rear perspective view of the present testing and labeling apparatus shown in FIG. 1 with a cover of the housing being removed therefrom.

Referring now to FIGS. 1 and 5, the apparatus 10 comprises a housing 24 which defines a generally planar top surface 26. Attached to the housing 24 is a hollow cover 28. When attached to each other, the housing 24 and cover 28 collectively define an interior chamber of the apparatus 10. The cover 28 is sized relative to the housing 24 such that a portion of the top surface 26 is shielded or covered by the cover 28. As such, one of the sides or walls of the interior chamber collectively defined by the housing 24 and cover 28 is itself defined by that portion of the top surface 26 shielded by the cover 28. As seen in FIG. 1, access into the interior chamber is achieved via a pair of rectangularly configured openings 30 which are each defined by the cover 28 and the top surface 26, and are located between the covered and uncovered portions of the top surface 26. The use of the openings 30 will be described in more detail below. Disposed within the cover 28 is a pair of windows 32 for making visual observations of the performance of the apparatus 10. Also disposed within the cover 28 between the windows 32 is a monitor 34 for providing the user of the apparatus 10 with various information related to its operation.

CASSETTE TRAYS

Referring now to FIGS. 1–3, the circuit boards 12 to be tested and labeled by the apparatus 10 are preferably initially placed into a cassette tray 36 which is of an industry standard size and configuration. The cassette tray 36, which is preferably fabricated from a plastic material, includes a hollow peripheral wall 38 which has a generally rectangular cross-sectional configuration and defines two (2) opposed pairs of wall segments, with each pair extending in generally parallel relation to each other. Extending perpendicularly between one pair of the wall segments is a hollow bisecting wall 40 of the cassette tray 36. The peripheral and bisecting walls 38, 40 collectively define a pair of elongate recesses or troughs 42 which extend in side-by-side relation to each other.

Formed in each side of the bisecting wall 40 and in the inner side of each of the wall segments extending in generally parallel relation thereto are a plurality of slots 44. The slots 44 are arranged so as to define opposed pairs which extend in equidistantly spaced relation to each other along each of the troughs 42. Extending linearly between the slots 44 of each pair is an elongate groove or channel 46 which is formed within that surface of the cassette tray 36 defining the floor of a respective trough 42. The distance separating the slots 44 from each other slightly exceeds the length of a circuit board 12. As seen in FIGS. 2 and 3, each circuit board 12 is held within a cassette tray 36 by slidably inserting the lateral edges 18 of the base board 14 thereof into respective ones of the slots 44 of a pair within one of the troughs 42. The circuit board 12 is oriented such that when the lateral edges 18 are fully inserted into the slots 44 of a particular pair, the longitudinal edge 16 of the base board 14 having the pads 20 extending therealong is received into the channel 46 extending between the slots 44.

The preferred cassette tray 36 includes twenty five (25) pairs of slots 44 and twenty five (25) channels 46 within each trough 42 thereof, thus accommodating twenty five (25) circuit boards 12 which extend in spaced, generally parallel relation to each other within the trough 42. As such, since each cassette tray 36 defines two (2) identically configured troughs 42, the same is able to accommodate up to fifty (50) circuit boards 12 which extend in parallel, side-by-side rows therewithin. Importantly, the spacing between each pair of slots 44 and the corresponding channels 46 within the cassette tray 36 is such that the memory chip(s) 22 secured to one or both of the opposed sides or faces of the base boards 14 of the circuit boards 12 stored within the cassette tray 36 will not interfere with each other.

TRAY EXCHANGER ASSEMBLIES

Figure 4A:
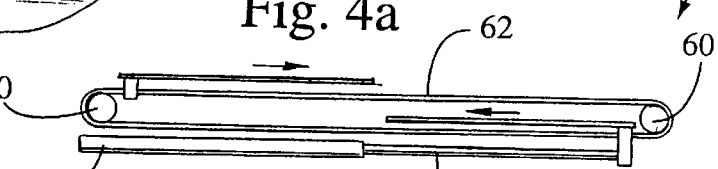
FIG. 4a is a side elevational view of one of the tray exchanger assemblies of the present testing and labeling apparatus, illustrating a preferred mode of operation thereof.

Referring now to FIGS. 1, 4 and 4a, the apparatus 10 of the present invention includes a pair of identically configured tray exchanger assemblies, and more particularly an input tray exchanger assembly 48a and an output tray exchanger assembly 48b. The input and output tray exchanger assemblies 48a, 48b are each attached to the top surface 26 of the housing 24 and extend through respective ones of the openings 30, such that approximately one-half of each of the input and output tray exchanger assemblies 48a, 48b is disposed within the interior chamber of the apparatus 10.

The input tray exchanger assembly 48a comprises a pair of elongate side rails 50 which are attached to the top surface 26 so as to extend in spaced, generally parallel relation to each other. Slidably attached to the top segment of each of the side rails 50 is a top plate 52 which has a generally square configuration. Similarly, slidably attached to the bottom segment of each of the side rails 50 is a bottom plate 54 which is identically configured to the top plate 52 and also has a generally square configuration. The top plate 52 is slidably movable along almost the entire lengths of the top segments of the side rails 50, with the bottom plate 54 being slidably movable along almost the entire lengths of the bottom segments thereof. Attached to the top surface of each of the top and bottom plates 52, 54 is a locator bar 56 which has a generally C-shaped configuration and is used for reasons which will be described in more detail below. The slidable attachment of the top and bottom plates 52, 54 to respective ones of the top and bottom segments of the side rails 50 is preferably accomplished through the use of convention linear roller or slide bearings.

As best seen in FIG. 4a, the input tray exchanger assembly 48a further includes a drive unit 58 for simultaneously moving the top and bottom plates 52, 54 back and forth relative to each other. The drive unit 58 comprises a pair of rotatable drive pulleys 60 which include an elongate, continuous drive cord 62 extending thereabout. The drive cord 60 is attached to both the top and bottom plates 52, 54 either directly or via one or more of the bearings associated therewith. The drive unit 58 further comprises a drive cylinder 64 having a piston rod 66 extending axially therefrom. The distal end of the piston rod 66 is attached to the drive cord 62 such that the extension of the piston rod 66 outwardly from the drive cylinder 64 facilitates the rotation of the drive cord 62 in a counter-clockwise direction as observed from the vantage point depicted in FIG. 4a, with the retraction of the piston rod 66 into the drive cylinder 64 facilitating the rotation of the drive cord 62 in a reverse, clockwise direction.

In the input tray exchanger assembly 48a, the top plate 52 is attached to the top segment of the drive cord 62, with the bottom plate 54 being attached to the lower segment thereof. As such, the extension of the piston rod 66 from the drive cylinder 64 facilitates the concurrent movement of the top and bottom plates 52, 54 in opposite directions, as does the retraction of the piston rod 66 into the drive cylinder 64. More particularly, when the top or bottom plate 52, 54 is disposed outside of the interior chamber of the apparatus 10, it is deemed to reside in a first position. When the top or bottom plate 52, 54 is disposed within the interior chamber of the apparatus 10, it is deemed to reside in a second position. In FIGS. 1, 4 and 4a, the top plate 52 is depicted in the first position, with the bottom plate 54 being depicted in the second position. As will be recognized, the subsequent retraction of the piston rod 66 into the drive cylinder 64 would facilitate the movement of the top plate 52 from the first position to the second position simultaneously with the movement of the bottom plate 54 from the second position to the first position. The re-extension of the piston rod 66 from the drive cylinder 64 would facilitate a reversal in movement, i.e., the movement of the top plate 52 back to the first position, with the return of the bottom plate 54 to the second position. The drive cylinder 64 may comprise either a pneumatic or hydraulic cylinder, though the same is preferably a pneumatic cylinder. It will be recognized that the components comprising the output tray exchanger assembly 48b are identical to those previously described in relation to the input tray exchanger assembly 48a, with the method of operation of the output tray exchanger assembly 48b also being identical to that of the input tray exchanger assembly 48a.

Referring now to FIGS. 2–4, the input and output tray exchanger assemblies 48a, 48b are each adapted to have two (2) cassette trays 36 positioned thereupon. More particularly, one cassette tray 36 is positionable upon the top plate 52 of each of the input and output tray exchanger assemblies 48a, 48b, with another cassette tray 36 being positionable upon the bottom plate 54 thereof. Since it is necessary to maintain the cassette trays 36 in prescribed positions upon the top surfaces of respective ones of the top and bottom plates 52, 54, the locator bars 56 are included thereupon. In this respect, as seen in FIGS. 2–4, each locator bar 56 is sized and configured to be receivable into the hollow interior of three (3) wall segments of the peripheral wall 38 of a cassette tray 36. When positioned upon respective ones of the top plates 52, 54, the pair of cassette trays 36 disposed upon each of the input and output tray exchanger assemblies 48a, 48b are alternatively movable between the first and second positions by the actuation of the associated drive unit 58.

LOADER ASSEMBLY

Referring now to FIGS. 5 and 6, the apparatus 10 of the present invention further comprises a robotic loader assembly 68 which is attached to the approximate center of the top surface 26 of the housing 24. As will be discussed in more detail below, the loader assembly 68 is used to remove circuit boards 12 from within the cassette tray 36 of the input tray exchanger assembly 48a in the second position two at a time, and return the circuit boards 12 two at a time to the cassette tray 36 of the output tray exchanger assembly 48b which is in the second position subsequent to the completion of the testing and labeling of the circuit boards 12. The loader assembly 68 is also used to transport circuit boards 12 between various assemblies of the apparatus 10 as will also be described in more detail below. As is apparent from FIGS. 1 and 5, the loader assembly 68 is attached to the top surface 26 at a location whereat the loader assembly 68 is disposed within the interior chamber of the apparatus 10.

The loader assembly 68 comprises a SCARA style robotic arm having a generally L-shaped first arm segment 70 which is rotatably attached to the top surface 26 of the housing 24. As seen in FIG. 5, the first arm segment 70 is rotatable relative to the housing 24 about a first loader axis LA1 which extends in generally perpendicular relation to the top surface 26. In addition to the first arm segment 70, the robotic arm comprises a second arm segment 72 which is rotatably connected to the distal end of the horizontally extending portion of the first arm segment 70 and is rotatable about a second loader axis LA2 relative thereto. As further seen in FIG. 5, the second loader axis LA2 extends in generally parallel relation to the first loader axis LA1.

In addition to the first and second arm segments 70, 72, the robotic arm of the loader assembly 68 comprises a third arm segment 74 which is rotatably connected to the end of the second arm segment 72 opposite that connected to the first arm segment 70. The third arm segment 74 is rotatable about a third loader axis LA3 relative to the second arm segment 72. The third loader axis LA3 itself extends in generally parallel relation to the first and second loader axes LA1, LA2. In addition to being rotatable about the third loader axis LA3, the third arm segment 74 of the robotic arm is movable linearly or vertically (i.e., upwardly and downwardly) therealong. Though not shown, the robotic arm of the loader assembly 68 includes internal components which allow the first arm segment 70 to be rotated about the first loader axis LA1, the second arm segment 72 to be rotated about the second loader axis LA2, and the third arm segment 74 to be rotated about or moved along the third loader axis LA3.

In addition to the robotic arm, the loader assembly 68 comprises a gripper 76 which is attached to the lower end of the third arm segment 74 of the robotic arm. The gripper 76 itself comprises a generally T-shaped support member 78 having a vertical segment 78a, the top end of which is attached to the lower end of the third arm segment 74. In addition to the vertical segment 78a, the support member 78 includes a horizontal segment 78b which is attached to the bottom end of the vertical segment 78a and extends in perpendicular relation thereto.

The gripper 76 further comprises three (3) actuator blocks 80 which are attached to the bottom surface of the horizontal segment 78b in spaced relation to each other. Movably attached to respective ones of the opposed ends of each of the actuator blocks 80 is a pair of generally L-shaped gripper fingers 82. Each of the gripper fingers 82 includes a vertically extending distal segment which includes a channel 86 formed in the inner surface thereof. In the gripper 76, each actuator block 80 is operable to selectively move the corresponding pair of gripper fingers 82 between a grasping position (shown in FIG. 6) and a release position as will be discussed in more detail below. Though not shown, each of the actuator blocks 80 includes internal components as are needed to facilitate the reciprocal movement of the corresponding pair of gripper fingers 82 between the grasping and release positions. As further seen in FIG. 6, attached to the bottom surface of each of the actuator blocks 80 is a pair of bumper members 84 which include grooves formed within the top surfaces thereof for slidably accommodating respective ones of the gripper fingers 82 of the corresponding pair. The use of the bumper members 84 will also be discussed in more detail below.

As is apparent from the foregoing description of the loader assembly 68, the gripper 76, and in particular the gripper fingers 82 thereof, may be maneuvered to a position above virtually any location upon that portion of the top surface 26 of the housing 24 shielded by the cover 28. As indicated above, the loader assembly 68 is attached to the top surface 26 of the housing 24 at a location whereat it is completely disposed within the interior chamber of the apparatus 10. In the apparatus 10, any circuit board 12 within any pair of slots 44 and corresponding channel 46 of a cassette tray 36 of the input tray exchanger assembly 48a which is in the second position is accessible by any pair of gripper fingers 82 of the gripper 76. Similarly, a circuit board 12 grasped or held within any pair of gripper fingers 82 of the gripper 76 may be maneuvered by the loader assembly 68 into alignment with and inserted into any pair of slots 44 and corresponding channel 46 of a cassette tray 36 of the output tray exchanger assembly 48b which is in the second position. Importantly, the spacing between each pair of gripper fingers 82 of the gripper 76 is identical to the spacing between each pair of slots 44 extending along each of the troughs 42 of the cassette tray 36.

Figure 8:
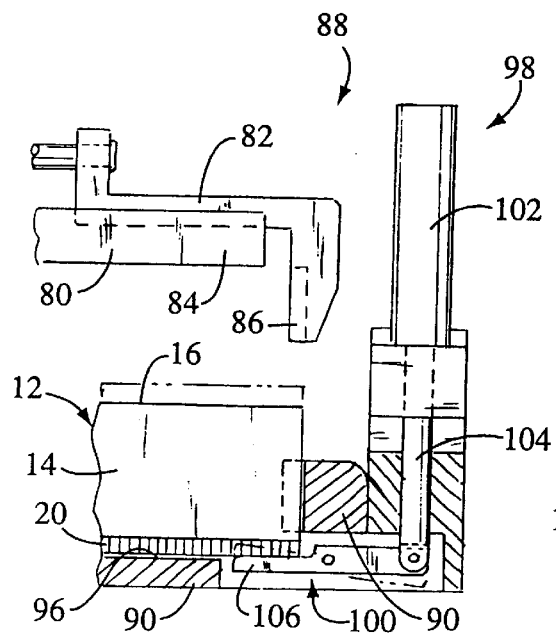
FIG. 8 is a cross-sectional view taken along line 8—8 of FIG. 7, illustrating a portion of one of the ejection assemblies of the present testing and labeling apparatus.

As seen in FIGS. 6 and 8, the "grasping" of a circuit board 12 by the gripper 76 to facilitate the removal thereof from within a cassette tray 36 is accomplished by initially maneuvering the robotic arm of the loader assembly 68 such that the bumper members 84 attached to one of the actuator blocks 80 are vertically and longitudinally aligned with the top longitudinal edge 16 of the base board 14 of a circuit board 12. The actuation of the gripper fingers 82 extending from the opposed ends of the actuator block 80 to the release position facilitates the alignment of the channels 86 therein with respective ones of the lateral edges 18 of the base board 14. The third arm segment 74 of the robotic arm is then moved downwardly along the third loader axis LA3 so as to facilitate the receipt of the lateral edges 18 of the base board 14 into respective ones of the channels 86. Such downward movement is discontinued when the top longitudinal edge 16 of the base board 14 is abutted against the bumper members 84.

Subsequent to such abutment, the gripper fingers 82 are actuated inwardly to their grasping position whereat they are brought into firm, abutting engagement with the lateral edges 18 of the base board 14. Such firm engagement results in the circuit board 12 being grasped within the gripper fingers 82 and raised out of the corresponding pair of slots 44 and channel 46 of the cassette tray 36 upon the subsequent upward movement of the third arm segment 74 along the third loader axis LA3. As seen in FIG. 6, the gripper fingers 82 of each pair are sized such that when a circuit board 12 is held therewithin (i.e., the gripper fingers 82 are in the grasping position and the top longitudinal edge 16 of the base board 14 is abutted against the bumper members 84), the bottom longitudinal edge 16 of the base board 14 having the pads 20 extending therealong protrudes from the distal ends of the gripper fingers 82.

As will be recognized, the "release" of a circuit board 12 to facilitate the placement thereof into a cassette tray 36 is accomplished in a reverse manner to that described in relation to the grasping and removal of a circuit board 12 from within a cassette tray 36. In this respect, the pair of gripper fingers 82 in which a circuit board 12 is held or grasped is maneuvered by the robotic arm of the loader assembly 68 such that the bottom longitudinal edge 16 of the base board 14 is vertically and longitudinally aligned with one of the channels 46 of a cassette tray 36, with the lateral edges 18 of the base board 14 being vertically aligned with respective ones of the corresponding pair of slots 44. The subsequent downward movement of the third arm segment 74 along the third loader axis LA3 facilitates the insertion of the lateral edges 18 of the base board 14 into respective ones of the slots 44, and the receipt of the longitudinal edge 16 having the pads 20 extending therealong into the corresponding channel 46. Thereafter, the gripper fingers 82 are actuated to the release position which results in the outward movement thereof out of firm engagement to the lateral edges 18 of the base board 14. The subsequent movement of the third arm segment 74 upwardly along the third loader axis LA3 results in the complete release of the circuit board 12 from within the gripper 76.

Importantly, due to the spacing between the pairs of gripper fingers 82 being identical to the spacing between the pairs of slots 44 extending along each trough 42 of a cassette tray 36, up to three (3) circuit boards 12 may be grasped by the gripper 76 and removed from within a cassette tray 36 of the input tray exchanger assembly 48a at the same time. Similarly, up to three (3) circuit boards 12 may be inserted by the gripper 76 into a cassette tray 36 of the output tray exchanger assembly 48b at the same time. Though the gripper 76 preferably includes three pairs of gripper fingers 82, those of ordinary skill in the art will recognize that greater or fewer pairs of gripper fingers 82 may be included therewith.

TESTING ASSEMBLY

Referring now to FIGS. 5, 7 and 8, the present apparatus 10 further comprises a testing assembly 88 which is attached to the top surface 26 of the housing 24 in close proximity to the back wall thereof. As such, the testing assembly 88 also resides within the interior chamber of the apparatus 10. The testing assembly 88 comprises a rectangularly configured test fixture 90 which includes four (4) elongate test slots 92 disposed therein. The test slots 92 extend perpendicularly between the longitudinal sides of the test fixture 90 in equidistantly spaced, generally parallel relation to each other. Extending along respective ones of the longitudinal sides of each test slot 92 in equidistantly spaced relation thereto is a pair of clearance channels 94. The spacing between each test slot 92 and its corresponding pair of clearance channels 94 is identical to the spacing between the pairs of gripper fingers 82 of the gripper 76. Additionally, the spacing between any two (2) clearance channels 94 which extend in side-by-side relation to each other is identical to the spacing between each pair of gripper fingers 82. Since two (2) clearance channels are associated with each test slot 92, a total of eight (8) clearance channels 94 are included in the test fixture 90. The test slots 92 and clearance channels 94 are each of a length which exceeds that of the base board 14 of a circuit board 12. Additionally, each of the test slots 92 includes a bottom surface 96 which is defined by a portion of the test fixture 90.

Referring now to FIGS. 7 and 8, the testing assembly 88 further comprises four (4) ejection mechanisms 98 which are cooperatively engaged to the test fixture 90 and operable to assist in the ejection of circuit boards 12 from within respective ones of the test slots 92. Though only one ejection mechanism 98 is shown in FIG. 7, it will be appreciated that three additional ejection mechanisms 98 are included in the testing assembly 88 and are oriented relative to respective ones of the three remaining test slots 92 in the same manner as depicted for the ejection mechanism 98 in FIG. 7. Each ejection mechanism 98 comprises a pair of identically configured lift tabs 100 which are pivotally connected to the test fixture 90 and disposed at respective ones of the opposed ends of a corresponding test slot 92 adjacent the bottom surface 96 thereof. In addition to the lift tabs 100, each ejection mechanism 98 includes a pair of cylinders 102 which are also each attached to the test fixture 90 and mechanically coupled to respective ones of the lift tabs 100.

More particularly, each of the cylinders 102 includes a piston rod 104 extending axially therefrom, the distal end of which is pivotally connected to one end of a respective lift tab 100. The cylinders 102 may comprise either pneumatic or hydraulic cylinders, but preferably comprise pneumatic cylinders.

In the testing assembly 88, the cylinders 102 of each ejection mechanism 98 are operable to concurrently move the corresponding lift tabs 100 between a testing position (shown in FIG. 8) and an ejection position (shown in phantom in FIG. 8). The retraction of the piston rods 104 into the cylinders 102 facilitates the movement of the shift tabs 100 to the testing position. When in the testing position, the generally planar top surface of a circuit board support portion 106 of each lift tab 100 is substantially flush or continuous with the bottom surface 96 of the corresponding test slot 92. The advancement or extension of the piston rods 104 from the cylinders 102 facilitates the pivotal movement of the lift tabs 100 to the ejection position whereat the circuit board support portions 106 thereof protrude into the interior of the corresponding test slot 92.

Though not shown, the testing assembly 88 further comprises eight sets or rows of testing fingers, with two sets or rows extending longitudinally within each test slot 92 in close proximity to the bottom surface 96 thereof. Cooperatively engaged to each set of testing fingers is an actuation bar which is used to selectively move the testing fingers into and out of contact with the pads 20 disposed on one or both of the opposed sides or faces of the base board 14 of a circuit board 12 inserted into the corresponding test slot 92. The structure and function of the testing fingers and the associated actuation bars is more fully described in U.S. Pat. No. 5,704,489 issued Jan. 6, 1998 which, as indicated above, is incorporated herein by reference.

In the apparatus 10, the insertion of a circuit board 12 into the testing assembly 88 occurs subsequent to the removal of the circuit board 12 from within the cassette tray 36 of the input tray exchanger assembly 48a which is in the second position in the above-described manner. More particularly, once a circuit board 12 has been grasped by the gripper 76 of the loader assembly 68 and transported to the testing assembly 88 thereby, such circuit board 12 is brought into vertical and longitudinal alignment with one of the test slots 92. After such alignment has been achieved, the downward movement of the third arm segment 74 of the robotic arm along the third loader axis LA3 facilitates the insertion of the circuit board 12 into the test slot 92. At this time, the lift tabs 100 are disposed in their testing position as shown in FIG. 8. The downward movement of the third arm segment 74 is continued until such time as the longitudinal edge 16 of the base board 14 including the pads 20 extending therealong is forced in between the two sets of testing fingers extending within the test slot 92. Importantly, since the base board 14 of the circuit board 12 protrudes from the distal ends of the gripper fingers 82, the insertion of the circuit board 12 into the test slot 92 is accomplished without the gripper fingers 82 coming into contact with the test fixture 90.

Subsequent to the insertion of the circuit board 12 into one of the test slots 92 in the above-described manner, the gripper fingers 82 of the pair in which the circuit board 12 is being held are moved to the release position, which is followed by the upward movement of the third arm segment 74 of the robotic arm along the third loader axis LA3. Upon the completion of a testing protocol upon the circuit board 12 inserted in the testing assembly 88, the same is re-grasped by the gripper 76 in the manner previously described in the section captioned Loader Assembly with regard to the removal of a circuit board 12 from within a cassette tray 36. However, prior to the circuit board 12 being re-grasped by the gripper 76, the lift tabs 100 of the ejection mechanism 98 associated with the test slot 92 into which the circuit board 12 is inserted are actuated to the ejection position so as to disengage the circuit board 12 from the corresponding sets of testing fingers. The movement of the lift tabs 100 to the ejection position results in a slight separation between the longitudinal edge 16 of the base board having the pads 20 extending therealong and the bottom surface 96 of the test slot 92. The disengagement of the circuit board 12 from the corresponding sets of testing fingers reduces the amount of upward force that must be applied to the circuit board 12 by the gripper 76 to facilitate its removal from within the test slot 92 subsequent to being re-grasped by a pair of the gripper fingers 82.

In the present apparatus 10, a circuit board 12 held within any pair of the gripper fingers 82 of the gripper 76 may be inserted into any test slot 92 of the test fixture 90, even if a circuit board 12 is held within either or both of the remaining two pairs of gripper fingers 82. For example, the circuit board 12 shown in FIG. 6 as being held by the middle pair of gripper fingers 82 may be inserted into any test slot 92 of the test fixture 90 even though a second circuit board 12 is being held within one of the outer pairs of gripper fingers 82. In this respect, such additional outer circuit board 12 would be accommodated by one of the clearance channels 94 within the test fixture 90 as the middle circuit board 12 is being lowered into one of the test slots 92. Indeed, even if circuit boards 12 were being held within all three pairs of gripper fingers 82 and one of the outer circuit boards 12 was to be inserted into one of the test slots 92, the two remaining circuit boards 12 could be accommodated by two successive clearance channels 94 within the test fixture 90.

Those of ordinary skill in the art will recognize that the test fixture 90 of the testing assembly 88 may be provided with greater or fewer than four (4) test slots 92, and that the number of ejection mechanisms 98 and sets of testing fingers included in the testing assembly 88 will correspond to the number of test slots 92 within the test fixture 90.

LABELER ASSEMBLY

Figure 9:
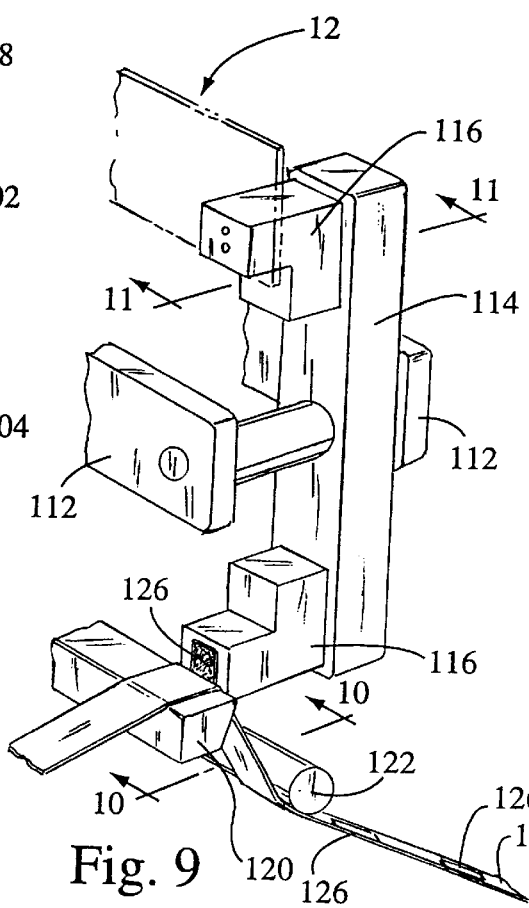
FIG. 9 is a cross-sectional view taken along line 9—9 of FIG. 5, illustrating a portion of the labeler assembly of the present testing and labeling apparatus.
Figure 10:
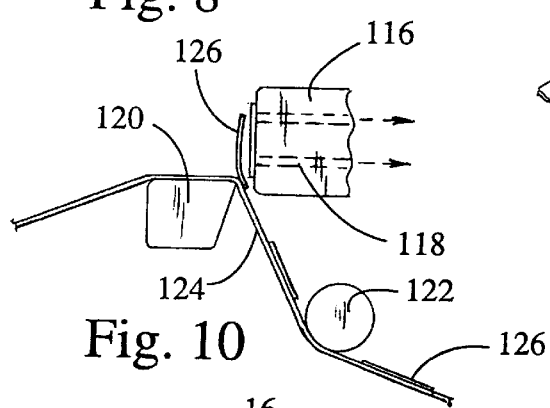
FIG. 10 is a cross-sectional view taken along line 10—10 of FIG. 9, illustrating the manner in which a label is transferred onto that portion of the labeler assembly shown in FIG. 9.
Figure 11:
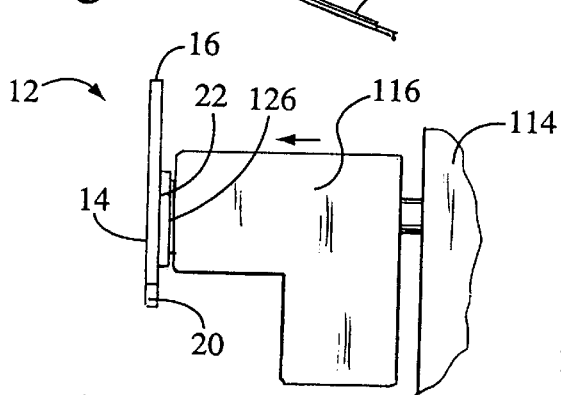
FIG. 11 is a cross-sectional view taken along line 11—11 of FIG. 9, illustrating the manner in which a label is applied to a circuit board.
Figure 12:
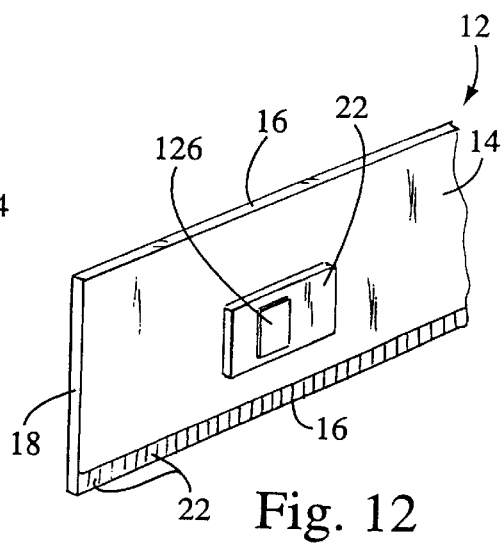
FIG. 12 is a partial perspective view of a circuit board subsequent to the completion of the testing thereof and the application of a label thereto.

Referring now to FIGS. 9–12, the apparatus 10 further comprises a labeler assembly 108 which is also attached to the top surface 26 of the housing 24 in relative close proximity to the testing assembly 88. Like the loader assembly 68 and the testing assembly 88, the labeler assembly 108 is also attached to the top surface 26 in a location whereat it is completely disposed within the interior chamber of the apparatus 10. The labeler assembly 108 comprises a support base 110 which is attached to the top surface 26 and includes a pair of flange portions 112 extending therefrom in spaced, parallel relation to each other. Rotatably mounted between the flange portions 112 is an elongate labeler arm 114 which is rotatable 360 degrees relative to the flange portions 112. Attached to a common side of the labeler arm 114 adjacent respective ones of the opposed ends thereof is an identically configured pair of label grippers 116. As best seen in FIGS. 9 and 10, each of the label grippers 116 includes a pair of fluid passages 118 which extend therethrough to the outermost, distal end thereof.

In addition to the above-described components, the labeler assembly 108 includes an elongate stripper bar 120 and an elongate guide roller 122. In the apparatus 10, the labeler assembly 108 is adapted to be used in conjunction with a label strip 124 which is provided with multiple, successive labels 126 disposed on a common side thereof. In the labeler assembly 108, the label strip 124 is passed underneath the guide roller 122 and over the top of the stripper bar 120. When the label strip 124 is extended through the labeler assembly 108 in this manner, the advancement of the label strip 124 in the direction designated by the arrows shown in FIGS. 9 and 10 facilitates the release of the labels 126 therefrom one at a time in the manner shown in FIG. 10.

During the operation of the labeler assembly 108, the release of a label 126 from the label strip 124 in the above-described manner occurs when the labeler arm 114 is vertically oriented such that the distal end of the lowermost one of the label grippers 116 is disposed immediately adjacent the released label 126. As the release of a label 126 from the label strip 124 is being facilitated by the passage of the label strip 124 over the stripper bar 120, a vacuum is created within the fluid passages 118 of the lowermost label gripper 116 which results in the released label 126 being secured thereto. As will be recognized, the surface of the released label 126 which is in direct contact with the distal end of the lowermost label gripper 116 is that surface which does not include any adhesive applied thereto.

Subsequent to the released label 126 being secured to the lowermost label gripper 116, the labeler arm 114 is rotated approximately 180 degrees so as to present the released label 126 at an elevated location whereat the face thereof having the adhesive applied thereto may be contacted by a circuit board 12 held within the gripper 76 of the loader assembly 68. Once the base board 14 or a memory chip 22 of the circuit board 12 has been brought in contact with the exposed face of the label 126, the vacuum within the fluid passages 118 of what is now the uppermost label gripper 116 is discontinued, thus causing the label 126 to remain adhered to the base board 14 or memory chip 22 as the circuit board 12 is pulled away from the uppermost label gripper 116 by the robotic arm of the loader assembly 68. As the process of the application of the label 126 to a circuit board 12 is occurring, the process of the securing of another label 126 to the lowermost label gripper 116 takes place. As such, the continued rotation of the labeler arm 114 in increments of approximately 180 degrees facilitates the successive presentation of labels 126 at an elevated location for contact by a circuit board 12.

SENSORS AND CALIBRATION

Referring now to FIGS. 5, 5a and 6, as is apparent from the foregoing description of each of the various assemblies of the apparatus 10, the movement of a circuit board 12 therebetween requires precision alignment. For example, the insertion and removal of the circuit boards 12 into and from within the cassette trays 36 and testing assembly 88 requires the precise alignment of the circuit boards 12 with the slots 44 and test slots 92. As will be described below, the apparatus 10 includes various sensors which are used to accomplish such precision alignment and further to facilitate the calibration of the apparatus 10.

The apparatus 10 is provided with a first sensor 128 which is attached to the gripper 76, and more particularly to the horizontal segment 78b of the support member 78 thereof. The first sensor 128 comprises a fiber optic segment 130 which defines a distal emitter tip 132 adapted to emit a light beam downwardly along a generally vertical axis. The first sensor 128 is a reflecting optical sensor which, in addition to emitting a light beam, is able to sense the light beam subsequent to the same being bounced off of a particular target. Due to its attachment to the support member 78, the first sensor 128 travels with the gripper 76.

In addition to the first sensor 128, the apparatus 10 includes a second sensor 134 which is attached to the top surface 26 of the housing 24 in relative close proximity to the testing assembly 88. The second sensor 134 comprises a cubic sensor block 136 which is preferably fabricated from aluminum and is precision machined to have a dimension of one inch by one inch by one inch. In addition to the sensor block 136, the second sensor 134 includes a fiber optic segment 138 which itself defines a distal emitter tip 140. The fiber optic segment 138 is extended through the sensor block 136 such that the emitter tip 140 defined thereby is precisely located in the center of and substantially flush with the planar top surface of the sensor block 136. The emitter tip 140 is adapted to emit a light beam upwardly along a generally vertical axis. Similar to the first sensor 128, the second sensor 134, in addition to emitting a light beam, is also adapted to sense the reflected light beam subsequent to the same bouncing off a particular target. In contrast to the first sensor 128 which moves with the gripper 76, the second sensor 134 remains in a fixed location.

The calibration of the apparatus 10 through the use of the first and second sensors 128, 134 is initiated by a single circuit board 12 (or a mock-up module dimensioned the same as the circuit board 12 and easier to sense) being grasped by the gripper 76 of the loader assembly 68 and transported to the second sensor 134. The circuit board 12 or mock-up module is preferably grasped by the middle or centermost set of gripper fingers 82. The loader assembly 68 moves the circuit board 12 over the emitter tip 140 of the second sensor 134 to find the x, y, z and theta of the circuit board 12 held within the center set of gripper fingers 82. Thereafter, the emitter tip 132 of the first sensor 128 is passed over the sensor block 136 of the second sensor 134 to find the x, y, z and theta of the sensor block 136. With the knowledge of these values, the software of the control unit of the apparatus 10 is able to calculate the exact location of the emitter tip 132 of the first sensor 128 relative to the circuit board 12.

Since the distance between each set of the gripper fingers 82 is precisely set during the assembly of the apparatus 10, the assumption is made that all circuit boards 12 that are subsequently picked-up by the gripper 76 occupy the exact location therewithin occupied by the circuit board 12. As a result, the exact location of all the sets of gripper fingers 82 and all circuit boards 12 therewithin relative to the emitter tip 132 of the first sensor 128 are known. Thereafter, the loader assembly 68 is used to pass the emitter tip 132 of the first sensor 128 over all the assemblies of the apparatus 10 so as to determine where to move the circuit boards 12 during the operation of the apparatus 10. For example, the first sensor 128 may be used to scan the x, y, z and theta of the test slots 92, slot 44, labeler assembly 108, or whatever other component or assembly is subsequently added to the apparatus 10.

APPARATUS OPERATION

Having thus described the components of the testing and labeling apparatus 10 of the present invention, the preferred mode of operation thereof will now be discussed below.

Upon the start-up of the apparatus 10, the same is initially calibrated through the use of a single circuit board 12 or mock-up module and the first and second sensors 128, 134 in the above-described manner. A cassette tray 36 filled with untested and unlabeled circuit boards 12 is then placed upon the input tray exchanger assembly 48a, and more particularly the top plate 52 thereof which is in the first position. Subsequent to the placement of the cassette tray 36 upon the top plate 52, the input tray exchanger assembly 48a is actuated so as to facilitate the movement of the top plate 52 to the second position within the interior chamber of the apparatus 10. As indicated above, the movement of the top plate 52 to the second position results in the concurrent movement of the bottom plate 54 from the second position to the first position. After the top plate 52 has been moved to the second position, another cassette tray 36 filled with untested and unlabeled circuit boards 12 may be positioned upon the bottom plate 54. If an emptied cassette tray 36 is already on the bottom plate 54, the same is simply removed therefrom and replaced with a cassette tray 36 filled with the untested and unlabeled circuit boards 12. Those of ordinary skill in the art will recognize that the sequence of loading untested and unlabeled circuit boards 12 into the apparatus 10 may be initiated with the bottom plate 54 of the input tray exchanger assembly 48a initially being oriented in the first position.

Subsequent to the positioning of the cassette tray 36 holding the untested and unlabeled circuit boards 12 in the second position on the input tray exchanger assembly 48a, the loader assembly 68, and more particularly the gripper 76 thereof, is used to simultaneously grasp and remove two untested and unlabeled circuit boards 12 from within such cassette tray 36. Such grasping and removal is accomplished in the manner previously discussed in the section captioned Loader Assembly. Subsequent to being removed from within the cassette tray 36, the two untested and unlabeled circuit boards 12 are inserted into respective ones of the test slots 92 of the testing assembly 88 by the gripper 76 of the loader assembly 68. The insertion of the two untested and unlabeled circuit boards 12 into the test slots 92 is accomplished one at a time in the manner previously described in the section captioned Testing Assembly. In this respect, as one of the untested and unlabeled circuit boards 12 is inserted into one of the test slots 92, the remaining circuit board 12 is accommodated by one of the clearance channels 94 within the test fixture 90. After the two untested and unlabeled circuit boards 12 have been inserted into the test fixture 90, the gripper 76 is maneuvered by the robotic arm of the loader assembly 68 back to the cassette tray 36 of the input tray exchanger assembly 48a in the second position, and caused to grasp and remove two more untested and unlabeled circuit boards 12 therefrom. These two additional untested and unlabeled circuit boards 12 are inserted into the remaining two test slots 92 of the testing assembly 88 in the previously described manner.

Upon each untested and unlabeled circuit board 12 being inserted into a respective one of the test slots 92, a testing protocol is performed thereon by the testing assembly 88. After all four test slots 92 of the test fixture 90 have initially been filled with untested and unlabeled circuit boards 12, the gripper 76 is maneuvered back to the cassette tray 36 of the input tray exchanger assembly 48a in the second position and caused to grasp and remove two more untested and unlabeled circuit boards 12 from therewithin. The gripper 76 is then maneuvered by the robotic arm of the loader assembly 68 back to the testing assembly 88 and manipulated so as to cause two of the now tested circuit boards 12 within the test fixture 90 to be replaced with the two untested and unlabeled circuit boards 12 now being held within the gripper 76 one at a time.

More particularly, one of the tested circuit boards 12 is grasped by the remaining, vacant pair of gripper fingers 82 of the gripper 76 and pulled or removed from within its test slot 92. The now vacant test slot 92 is then filled with one of the two untested and unlabeled circuit boards 12 being held within one of the other two pairs of gripper fingers 82 of the gripper 76. Subsequent to the insertion of the untested and unlabeled circuit board 12 into the vacant test slot 92, the now vacant pair of gripper fingers 82 is used to grasp and remove another tested circuit board 12 from within another test slot 92 of the test fixture 90. Subsequent to such removal, the last remaining untested and unlabeled circuit board 12 held within the gripper 76 is inserted into the vacant test slot 92. Upon the completion of such insertion, two tested circuit boards 12 are held within respective pairs of the gripper fingers 82 of the gripper 76, with one pair of the gripper fingers 82 being empty and not holding a circuit board 12. However, all four test slots 92 are still filled with circuit boards 12, with two of the test slots 92 having new untested and unlabeled circuit boards 12 inserted thereinto, and the remaining two test slots 92 including circuit boards 12 disposed therein which are having the testing protocol performed thereupon.

Subsequent to the completion of the aforementioned replacement procedure, the two tested circuit boards 12 held within the gripper 76 are transported by the robotic arm of the loader assembly 68 to the labeler assembly 108. Thereafter, one of the circuit boards 12 is maneuvered by the robotic arm of the loader assembly 68 into contact with the label 126 secured to the uppermost label gripper 116, thus facilitating the adhesion of the label 126 to either the base board 14 or a memory chip 22 of the circuit board 12 in the manner previously described in the section captioned Labeler Assembly. As previously explained, such adhesion is accomplished by discontinuing the vacuum in the fluid passages 118 of the uppermost label gripper 116. The circuit board 12 having the label 126 applied thereto is then retracted away from the uppermost label gripper 116, which is immediately followed by the rotation of the labeler arm 114 180 degrees. The remaining, unlabeled circuit board 12 being held within the gripper 76 is then itself brought into contact with the uppermost label gripper 116 which now has a label 126 secured thereto, with the adhesion of the label 126 to the base board 14 or a memory chip of the remaining circuit board 12 being accomplished in an identical manner to that described in relation to the other circuit board 12.

After a label 126 has been applied to each of the tested circuit boards 12, the now tested and labeled circuit boards 12 held within the gripper 76 are transported by the robotic arm of the loader assembly 68 to the cassette tray 36 of the output tray exchanger assembly 48b which is in the second position. The gripper 76 is then maneuvered so as to facilitate the simultaneous insertion of the two tested and labeled circuit boards 12 into the cassette tray 36 in the manner previously described in the section captioned Loader Assembly. Thereafter, the gripper 76 is transported by the robotic arm of the loader assembly 68 back to the cassette tray 36 of the input tray exchanger assembly 48a in the second position to grasp and remove two additional untested and unlabeled circuit boards 12 from therewithin. The above-described process is then continuously repeated until such time as all the circuit boards 12 within the cassette tray 36 of the input tray exchanger assembly 48a in the second position have been removed from therewithin, and the cassette tray 36 of the output tray exchanger assembly 48b in the second position is completely filled with the tested and labeled circuit boards 12. Thereafter, the input and output tray exchanger assemblies 48a, 48b are each actuated in the aforementioned manner so that a new cassette tray 36 filled with untested and unlabeled circuit boards 12 is placed in the second position upon the input tray exchanger assembly 48b, and a new unfilled cassette tray 36 is placed in the second position upon the output tray exchanger assembly 48b.

The apparatus 10 of the present invention includes a programmable control unit which controls and coordinates the operations of the tray exchanger, loader, testing and labeler assemblies 48a, 48b, 68, 88, 108 thereof. All operations of the apparatus 10, including the results of the test performed upon the circuit boards 12, may be monitored via the monitor 34 included on the cover 28. Additionally, certain aspects of the operation of the apparatus 10 may be visually observed through the windows 32 of the cover 28. If during the performance of the testing protocol thereon, a particular circuit board 12 fails to pass the test, the programmable control unit of the apparatus 10 is operable to cause the loader assembly 68 not to apply a label to the failed circuit board 12, and to direct the same into a prescribed reject location either within or outside of the interior chamber rather than placing the failed circuit board 12 into the cassette tray 36 of the output tray exchanger assembly 48b in the second position.

ALTERNATIVE EMBODIMENTS

Figure 13:
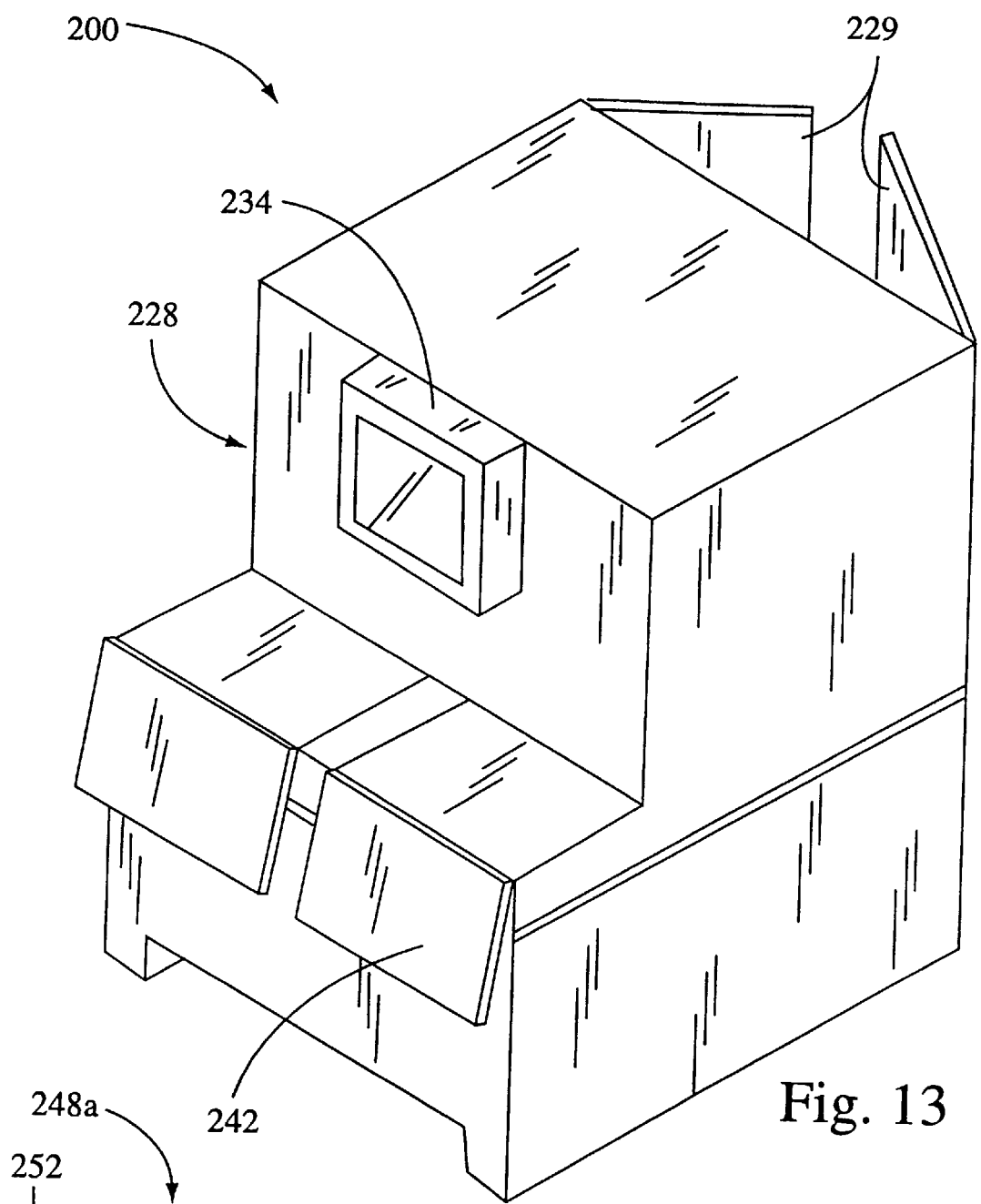
FIG. 13 is a front, top perspective view of an automated testing apparatus constructed in accordance with a second embodiment of,the present invention.

Referring now to FIG. 13, there is depicted a circuit board testing apparatus 200 which is constructed in accordance with a second embodiment of the present invention. The apparatus 200 is similar to the previously described apparatus 10, but does not include the labeler assembly 108. Additionally, the apparatus 200 includes an alternatively configured input tray exchanger assembly 248a which will be described in more detail below.

In addition to the foregoing, one of the primary distinctions between the apparatus 200 of the second embodiment and the previously described apparatus 10 is that the apparatus 200 is provided with a temperature control unit which is operable to maintain the temperature within the interior chamber defined by the cover 228 thereof at a prescribed level. In this respect, approximately the upper one-half of the apparatus 200 is an environmental chamber, with the walls of the cover 228 being provided with two inch thick insulation. The air temperature within the interior chamber defined by the cover 228 is controlled by an attached air temperature control unit which has both a refrigeration unit and a heating unit to test circuit boards 12 at either hot or cold temperatures. The temperature control unit of the apparatus 200 is preferably configured so as to allow testing to be conducted in the range of from about 0°C. to about 90° C. As in the apparatus 10, a monitor 234 is disposed within the front of the cover 228 for monitoring the operation of the apparatus 200. Additionally, as further seen in FIG. 13, the cover 228 of the apparatus 200 is preferably provided with a pair of swinging doors 229 at the back thereof for providing access into the interior chamber defined thereby. Though not shown, such doors may also be provided in the cover 28 of the apparatus 10.

As indicated above, in the apparatus 200, the temperature within the interior chamber may be selectively raised or lowered, depending on the desired temperature for the performance of the testing protocol upon the circuit boards 12. As such, the inclusion of the temperature control unit with the apparatus 200 allows the testing of the circuit boards 12 to be conducted while the circuit boards are being maintained at an elevated temperature or at a reduced temperature, rather than at ambient temperature. However, when the circuit boards 12 are to be tested under these conditions, it is necessary to increase the "soak" time (i.e., pre-heat or pre-cool time) for the circuit boards 12 prior to the same being picked from a cassette tray 36 of the input tray exchanger assembly 248a and placed into the testing assembly of the apparatus 200.

Figure 14:
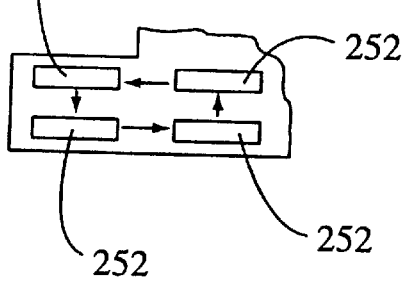
FIG. 14 is a schematic illustrating the manner in which one of the tray exchanger assemblies of the testing apparatus of the second embodiment operates.

To afford the appropriate level of soak time, the input tray exchanger assembly 248a of the apparatus 10 is configured to increase the number of cassette trays 36 which may be held within the interior chamber of the cover 228. More particularly, as seen in FIG. 14, rather than using a cable driven system as previously described in relation to the input tray exchanger assembly 48a, the input tray exchanger assembly 248a employs a "round robin" system specifically adapted for use in relation to the apparatus 200. However, this alternative input tray exchanger assembly 248a is used only on the input side of the apparatus 200, with the output tray exchanger assembly thereof preferably being the same as the previously described output tray exchanger assembly 48b.

The input tray exchanger assembly 248a of the apparatus 10 is adapted to accommodate three (3) cassette trays 36 at the same time. In the use of the apparatus 200, the operator initially pivots the input access door 242 of the cover 228 upwardly to its open position, thereby gaining access to the input tray exchanger assembly 248a within the temperature controlled interior chamber of the cover 228. As will be recognized, the input access door 242 is located at the input side of the apparatus 200. Thereafter, a cassette tray 36 filled with untested circuit boards 12 is loaded into the input tray exchanger assembly 248a so as to be located at the upper, front position thereof (with front meaning closest to the input access door 242). The operator then returns the input access door 242 to its closed position as shown in FIG. 13.

When the input access door 242 has been closed, the cassette tray 36 in the upper, front position and the cassette tray 36 disposed immediately below it (i.e., in the lower, front position) are "soaked" within the interior chamber as the loader assembly 68 removes circuit boards 12 from within the cassette tray 36 located in the lower, rear position of the input tray exchanger assembly 248a. As this particular cassette tray 36 is being emptied, there is no cassette tray 36 located in the upper, rear location of the input tray exchanger assembly 248a. Upon the emptying of the lower, rear cassette tray 36, the cassette trays 36 within the interior chamber are moved to a new position one at a time in a round-robin, counter-clockwise motion when viewed from the right side of the apparatus 200. More particularly, the now empty lower, rear cassette tray 36 is pushed upwardly by a vertical air cylinder and held in the upper, rear position by latches. The cassette tray 36 previously in the lower, front position is then moved to occupy the lower, rear position, with the cassette tray 36 previously in the upper, front position then being moved downwardly to occupy the lower, front position. Finally, the empty cassette tray 36 is moved from the upper, rear position to the upper, front position, thus exposing the cassette tray 36 in the lower, rear position to allow the circuit boards 12 to be removed therefrom. The operator can then re-open the input access door 242 on the input side of the apparatus 10 and remove the empty cassette tray 36, replacing it with another cassette tray 36 full of untested circuit boards 12. The closing of the input access door 242 facilitates a repeat of the aforementioned process. As will be recognized, this particular sequence allows three (3) rather than two (2) cassette trays 36 to be disposed within the input side of the apparatus 10, with two (2) cassette trays 36 pre-soaking at temperature while the remaining cassette tray 36 is having the circuit boards 12 removed therefrom via the loader assembly 68.

As will be recognized, in the apparatus 200 constructed in accordance with the second embodiment, the loader assembly 68 is disposed within the temperature controlled interior chamber defined by the cover 228. Since the various components (e.g., motors, actuators) of the loader assembly 68 have a maximum operating threshold of 40° C., the surfaces of the loader assembly 68 are insulated since the interior chamber of the apparatus 200 may reach temperatures of up to 90°C. Because the loader assembly 68 may be subjected to extreme temperature fluctuations within the chamber, the robotic arm thereof is preferably substantially encased in a layer of insulating material. In addition to the surfaces of the loader assembly 68 being insulated, room temperature ambient air is pumped into the motors thereof within the base of the loader assembly 68 to maintain these mechanisms at their prescribed operating temperature of 40°C. or less. More specifically, the encasement of the loader assembly 68 and the robotic arm with the insulating material, coupled with the circulation of air through the interior thereof, allows the loader assembly 68 to remain operative despite being subjected to elevated or reduced temperatures within a broad temperature range.

As previously explained, in the apparatus 10, the first and second sensors 128, 134 are used to accomplish a calibration process upon initial start-up. These sensors are also provided in the apparatus 200 of the second embodiment. In the apparatus 200, as the interior chamber is heated or cooled, the various components and assemblies therewithin are subjected to thermal expansion or contraction. For example, the top surface of the housing may expand 0.050 inches when the same is heated from 0°C. to 100° C. As a result, in the apparatus 200, all the positions initially calibrated by the first and second sensors thereof at ambient temperature are off when the temperature is increased or decreased. However, in the apparatus 200, the first and second sensors are used for repeated recalibration at temperature which is conducted automatically without operator intervention (i.e., the operator does not need to be exposed to increased or decreased temperature). In the apparatus 200, the testing of circuit boards 12 will typically begin after a 30 minute warm-up or cool-down time, since after this much time elapses, the interior chamber is typically at the desired testing temperature. However, though the interior chamber may be at the desired temperature, the metal parts of the various components and assemblies therewithin typically are not, thus causing the same to expand or contract over several hours, long after testing has been initiated. As such, it is contemplated that the recalibration routine in the apparatus 200 will run at 10 minute intervals until the system equalizes, or according to a stored set of data points which are based on tests of expansion and contraction over time.

In either embodiment of the present invention, the operating sequence may be quickly and easily modified and optimized as desired, which represents a departure from prior art systems which do not have this particular capability. In those instances where the test time for a circuit board 12 or other module is long (e.g., 100 seconds as opposed to 10 seconds) and where the testing assembly includes eight (8) rather than four (4) test slots, the handling sequence of the circuit boards 12 may be changed in order to optimize the system. More particularly, the gripper in this set-up would preferably be provided with five (5) sets of gripper fingers, with two "buffers" locations (i.e., an input buffer and an output buffer) being included within the top surface of the housing. The input and output buffers are identically configured, and each accommodate eight (8) circuit boards 12 arranged in a row (i.e., in spaced, generally parallel relation to each other). Additionally, both the input and output buffers would preferably be disposed in relative close proximity to the testing assembly.

In the system including eight test slots within the testing assembly, five sets of gripper fingers, and the previously described input and output buffers, the operating sequence would involve eight circuit boards 12 or other modules being loaded into the input buffer one at a time by the loader assembly. In this respect, a single set of gripper fingers would grasp the circuit boards 12 and remove them from a cassette tray 36 one at a time, with eight trips being needed by the loader assembly to facilitate the complete filling of the input buffer. When testing of the circuit boards 12 within the testing assembly is completed, four untested circuit boards 12 would be grasped and removed from within the input buffer using four of the five sets of gripper fingers of the gripper. The gripper would then be maneuvered to the test fixture and manipulated so as to cause the empty set of gripper fingers to grasp and remove a tested circuit board 12 from within one of the test slots of the testing assembly. An untested circuit board 12 held within a set of gripper fingers adjacent those holding the tested circuit board 12 would be inserted into the now empty test slot, with this sequence being repeated three more times so as to result in four sets of the gripper fingers holding tested circuit boards 12, one set of gripper fingers being empty, and four of the eight test slots having untested circuit boards 12 loaded thereinto. The four tested circuit boards 12 held within the gripper are then transported by the loader assembly to the output buffer and deposited thereinto. The above-described steps are repeated for the four remaining untested circuit boards 12 in the input buffer, the four remaining tested circuit boards 12 within the test slots, and the remaining four open slots in the output buffer. The eight trip loading of the input buffer is then repeated.

Using this particular sequence provides the advantages of no longer having to have the spacing between the slots 44 of each cassette tray 36 equivalent to the spacing between the sets of gripper fingers since the circuit boards 12 are removed from the cassette trays 36 one at a time by the loader assembly. Additionally, the handling time of the circuit boards 12 is minimized between the start and ending of the testing protocol, thus maximizing the throughput of the system.

It is further contemplated that either embodiment of the present invention may be modified to include magazine loader/unloader assemblies for accommodating vertically stacked trays of circuit boards 12 or modules so as to eliminate the need for the operator to load and unload the cassette trays 36 from within the cover every few minutes. Additionally, it is contemplated that the cassette trays 36 may be inputed into and removed from within the cover through the use of conveyors rather than through a manual operation. Additionally, either embodiment may be adapted for use on devices other than for circuit boards, such as memory chips, integrated circuit chips, power supplies or other electrical components requiring testing and labeling at either ambient temperature or a prescribed elevated or reduced temperature.

As is apparent from the foregoing description of both embodiments of the present invention, the same provides distinct advantages over circuit board handling devices known in the prior art. Two of the primary advantages of the present invention over competing concepts are its versatility and adaptability. In this respect, in either embodiment, the method of operation may be quickly and easily changed to suit the needs of a particular end user. Indeed, in most instances, customization to create dramatic changes in the operational sequence may be accomplished simply by making changes to the software of the programmable control unit. Examples of the versatility of the present invention include the ability to accommodate long test protocols by outfitting the same with eight test sites and the above-described buffer sequence making use of the input and output buffers, the ability to conduct temperature testing, the ability to provide labeling and bar code scanning capability, and the ability to self-calibrate the loader assembly and make adjustments to its operation based on changes in component or assembly positions.

The adaptability of the present invention is largely attributable to the inclusion of the SCARA style robotic arm in the loader assembly which has x, y, z and theta capabilities, rather than the use of multiple x, y, z gantries as is the current practice in the prior art. The robotic arm of the loader assembly possesses greater degrees of freedom, and hence the capability to transport circuit boards 12 or other modules between additional locations at which additional components such as buffers, scanners or labelers may be positioned. This is in contrast to prior art devices wherein it is extremely difficult to make dramatic changes in the movement pattern due to the use of the multiple x, y, z gantries.

Additional modifications and improvements of the present invention may also be apparent to those of ordinary skill in the art. Thus, the particular parts and steps described and illustrated herein are intended to represent only certain embodiments of the present invention, and are not intended to serve as limitations of alternative devices and methods within the spirit and scope of the invention.

What is claimed is:

1. An automated apparatus for testing a printed circuit board, the apparatus comprising:

a housing;

at least one tray exchanger assembly attached to the housing for accommodating at least one circuit board;

a testing assembly attached to the housing for conducting a testing protocol on the circuit board; and a loader assembly having a robotic arm with at least four-axes of mobility attached to the housing for transporting the circuit board between the tray exchanger assembly and the testing assembly, the robotic arm being rotatable about first, second and third loader axes and movable along the third loader axis.

2. The apparatus of claim 1 further comprising:

a labeler assembly attached to the housing for applying a label to the circuit board subsequent to the completion of the testing protocol thereon;

the loader assembly being operable to selectively transport the circuit board between the tray exchanger, testing and labeler assemblies.

3. The apparatus of claim 1 further comprising:

at least one cassette tray disposed on the tray exchanger assembly for accommodating the at least one circuit board;

the cassette tray being selectively movable between the first and second positions by the tray exchanger assembly.

4. The apparatus of claim 3 wherein:

two cassette trays are disposed on the tray exchanger assembly; and the tray exchanger assembly is configured such that the movement of one of the cassette trays to the second position results in the concurrent movement of the remaining one of the cassette trays to the first position.

5. The apparatus of claim 4 comprising a pair of tray exchanger assemblies attached to the housing.

6. The apparatus of claim 5 wherein:

each of the cassette trays is sized and configured to accommodate multiple circuit boards; and the loader assembly is operable to remove the circuit boards from the cassette tray of one of the tray exchanger assemblies which is in the second position, and return the circuit boards to the cassette tray of the remaining one of the tray exchanger assemblies which is in the second position subsequent to the completion of the testing protocol thereon and the application of the label thereto.

7. The apparatus of claim 1 wherein the testing assembly comprises:

a test fixture defining at least one test slot for partially receiving the circuit board; and at least one ejection mechanism cooperatively engaged to the test fixture and operable to assist in the ejection of the circuit board from within the test slot subsequent to the completion of the testing protocol thereon.

8. The apparatus of claim 7 wherein:

the test fixture defines four test slots; and the testing assembly includes four ejection mechanisms which are operable to assist in the ejection of circuit boards from within respective ones of the test slots.

9. The apparatus of claim 7 wherein the test slot defines a bottom surface and the ejection mechanism comprises:

a pair of lift tabs pivotally connected to the test fixture and disposed at respective ones of the opposed ends of the test slot adjacent the bottom surface thereof; and a pair of cylinders mechanically coupled to respective ones of the lift tabs;

the cylinders being operable to concurrently move the lift tabs between a testing position whereat the lift tabs are substantially continuous with the bottom surface of the test slot, and an ejection position whereat the lift tabs are pivoted upwardly so as to protrude into the test slot.

10. The apparatus of claim 1 wherein the loader assembly comprises:

a robotic arm rotatable about first, second and third generally parallel loader axes and movable along the third loader axis; and a gripper attached to the robotic arm and adapted to receive and releasably hold at least one circuit board.

11. The apparatus of claim 10 wherein the circuit board defines opposed pairs of longitudinal and lateral edges, and the gripper assembly comprises:

at least one actuator; and at least one pair of gripper fingers movably attached to the actuator in opposed relation to each other and selectively movable by the actuator between a holding position whereat the gripper fingers are engagable to respective ones of the lateral edges of the circuit board and a release position whereat the distance separating the gripper fingers from each other exceeds the length of the circuit board;

the gripper fingers being sized such that when in the holding position, one of the longitudinal edges of the circuit board protrudes therefrom.

12. The apparatus of claim 11 wherein the gripper assembly comprises:

three actuators; and three pairs of gripper fingers movably attached to respective ones of the actuators.

13. The apparatus of claim 2 wherein the labeler assembly comprises:

an elongate, rotatable labeler arm defining opposed ends; and a pair of label grippers attached to the labeler arm adjacent respective ones of the opposed ends thereof;

each of the label grippers being operable to selectively grasp and release the label to effectuate the transfer thereof from a label strip which includes multiple labels to the circuit board.

14. The apparatus of claim 13 wherein the labeler assembly further comprises:

a stripper bar for facilitating the release of the labels from the label strip in succession upon the advancement of the label strip thereover.

15. The apparatus of claim 13 wherein each of the label grippers includes at least one fluid passage which extends therein and is oriented such that the creation of a vacuum within the fluid passage facilitates the releasable engagement of the label to the label gripper for transport to the circuit board via the labeler arm, and the discontinuation of the vacuum within the fluid passage allows the label to be released from the label gripper and adhered to the circuit board.

16. The apparatus of claim 3 wherein:

the tray exchanger, testing, and loader assemblies are each disposed within the housing; and the automated apparatus further includes a temperature control unit attached to the housing for maintaining the temperature therewithin at a prescribed level.

17. An automated method of testing a printed circuit board using an automated testing apparatus which includes at least one tray exchanger assembly, a testing assembly, and a loader assembly having a robotic arm with at least four-axes of mobility, the method comprising the steps of:

(a) positioning at least one circuit board on the tray exchanger assembly;

(b) moving the robotic arm of the loader assembly in at least four-axes towards the tray exchanger assembly, the four-axes of mobility being defined by rotation about first, second and third loader axes and movement along the third loader axis;

(c) removing the circuit board from the tray exchanger assembly via the robotic arm of the loader assembly;

(d) transferring the circuit board from the loader assembly to the testing assembly;

(e) conducting a testing protocol upon the circuit board within the testing assembly; and (f) transporting the circuit board from the testing assembly to the tray exchanger assembly via the four-axes of movement of the robotic arm.

18. The method of claim 17 wherein the testing apparatus further includes a labeler assembly, and step (f) comprises the steps of:

(1) transporting the circuit board from the testing assembly to the labeler assembly via the loader assembly;

(2) applying a label to the circuit board via the labeler assembly; and (3) transporting the circuit board from the labeler assembly to the tray exchanger assembly via the loader assembly.

19. The method of claim 18 wherein the testing apparatus further includes a pair of cassette trays which are placeable upon the tray exchanger assembly and alternately movable between first and second positions thereby, and step (a) comprises:

(1) positioning multiple untested circuit boards upon at least one of the cassette trays;

(2) placing the cassette tray which includes the untested circuit boards upon the tray exchanger assembly such that the cassette tray including the untested circuit boards is disposed in the first position; and (3) actuating the tray exchanger assembly so as to facilitate the movement of the cassette tray including the untested circuit boards to the second position concurrently with the movement of the remaining cassette tray to the first position such that the untested circuit boards are removable from the cassette tray in the second position via the loader assembly.

20. The method of claim 19 wherein the testing apparatus includes a pair of tray exchanger assemblies, and:
   step (c) comprises removing the untested circuit boards from the cassette tray of one of the tray exchanger assemblies which is in the second position; and
   step (f) (3) comprises transporting tested circuit boards from the labeler assembly to the cassette tray of the remaining one of the tray exchanger assemblies which is in the second position.

21. The method of claim 20 wherein the loader assembly is adapted to releasably hold at least three circuit boards at the same time, the testing assembly is adapted to accommodate at least four circuit boards at the same time, and:
   step (c) comprises concurrently removing two untested circuit boards from the cassette tray of one of the tray exchanger assemblies which is in the second position;
   step (d) comprises replacing two tested circuit boards within the testing assembly with the two untested circuit boards concurrently removed from within the cassette tray;
   step (f) (2) comprises applying a label to each of the two tested circuit boards removed from within the testing assembly; and
   step (f) (3) comprises transporting the two tested circuit boards having the labels applied thereto to the cassette tray of the remaining one of the tray exchanger assemblies which is in the second position.

22. The method of claim 17 wherein the testing assembly includes a test fixture defining at least one test slot, and at least one ejection mechanism which is attached to the test fixture, and:
   step (d) comprises inserting the circuit board into the test slot of the test fixture; and
   step (f) (1) comprises actuating the ejection mechanism to disengage the circuit board from the test fixture.

23. The method of claim 18 wherein the labeler assembly includes a rotatable labeler arm having a pair of label grippers attached thereto, and step (f) (2) comprises:
   (i) grasping a label via one of the label grippers;
   (ii) rotating the labeler arm approximately 180 degrees;
   (iii) moving the circuit board into contact with the label via the loader assembly such that the label is adhered to the circuit board; and
   (iv) releasing the label from the label gripper.

24. The method of claim 17 wherein step (e) comprises bringing the circuit board to a selected temperature level prior to the initiation of the testing protocol thereon.

25. The method of claim 17 wherein:
   the tray exchanger assembly is operable to selectively move the circuit board between first, second, third and fourth positions, with the loader assembly being operable to transport the circuit board between the tray exchanger assembly and the testing assembly when the circuit board is moved to the third position;
   three cassette trays are disposed on the tray exchanger assembly, with each of the cassette trays accommodating at least one circuit board; and
   the tray exchanger assembly is configured such that the movement of one of the cassette trays from the third position to the fourth position is followed by the movement of one of the cassette trays from the second position to the third position, the movement of one of the cassette trays from the first position to the second position, and the movement of the cassette tray in the fourth position to the first position.

26. The method of claim 17 wherein the testing apparatus further includes three cassette trays which are placable upon the tray exchanger assembly and moveable between first, second, third and fourth positions thereby, and step (a) comprises:
   (1) positioning multiple untested circuit boards upon one of the cassette trays;
   (2) placing the cassette tray which includes the untested circuit boards upon the tray exchanger assembly such that the cassette tray including the untested circuit boards is disposed in the first position; and
   (3) actuating the tray exchanger assembly so as to facilitate the sequential movement of one of the cassette trays from the third position to the fourth position, one of the cassette trays in the second position to the third position, the cassette tray including the untested circuit boards from the first position to the second position, and the movement of the cassette tray in the fourth position to the first position.

27. The method of claim 24 wherein the testing apparatus further includes a pair of calibration sensors, and the method further includes the step of:
   (e) using the calibration sensors to periodically re-calibrate the loader assembly to facilitate proper alignment with the tray exchanger assembly and the testing assembly.

28. The method of claim 17 her comprising the step of substantially encasing the robotic arm with a layer of thermally insulating material prior to step (a).

29. The method of claim 17 further comprising the step of substantially encasing the loader assembly with a layer of thermally insulating material prior to step (a).

30. The method of claim 17 further comprising the step of circulating air through the loader assembly and the robotic arm as steps (a)–(f) are being conducted.

31. An automated apparatus for testing a printed circuit board, the apparatus comprising:
   a housing with a temperature control unit for maintaining the temperature therewithin at a prescribed level;
   at least one tray exchanger assembly attached to the housing for accommodating at least one circuit board;
   a testing assembly attached to the housing for conducting a testing protocol on the circuit board; and
   a robotic arm attached to the housing for transporting the circuit board between the tray exchanger assembly and the testing assembly, the robotic arm being substantially encased in a layer of thermally insulating material.

32. The apparatus of claim 31 wherein the temperature control unit is operable to circulate air over the robotic arm for maintaining the loader assembly and the robotic arm within a prescribed operating temperature range.

33. The apparatus of claim 31 wherein:
   the robotic arm is rotatable about first, second and third generally parallel loader axes and movable along the third loader axes; and
   a gripper attached to the robotic arm and adapted to receive and releasably hold at least one circuit board.

34. The apparatus of claim 33 wherein the circuit board defines opposed pairs of longitudinal and lateral edges, and the gripper assembly comprises:
   at least one actuator; and
   at least one pair of gripper fingers movably attached to the actuator in opposed relation to each other and selectively movable by the actuator between a holding position whereat the gripper fingers are engagable to respective ones of the lateral edges of the circuit board and a release position whereat the distance separating the gripper fingers from each other exceeds the length of the circuit board;

the gripper fingers being sized such that when in the holding position, one of the longitudinal edges of the circuit board protrudes therefrom.

* * * * *